United States Patent [19]

Hill et al.

[11] Patent Number: 4,517,516

[45] Date of Patent: May 14, 1985

[54] NMR PROBE COIL FORM STRUCTURE

[75] Inventors: Howard D. Hill, Cupertino; Albert P. Zens, Fremont, both of Calif.

[73] Assignee: Varian Associates, Inc., Palo Alto, Calif.

[21] Appl. No.: 483,351

[22] Filed: Apr. 8, 1983

[51] Int. Cl.³ ............................................. G01R 33/08
[52] U.S. Cl. ..................................... 324/318; 324/321
[58] Field of Search ................. 324/318, 321, 319, 322

[56] References Cited

U.S. PATENT DOCUMENTS

| 4,254,373 | 3/1981 | Lippmaa | 324/321 |
| 4,388,601 | 6/1983 | Sneed | 324/318 |
| 4,398,149 | 8/1983 | Zens | 324/319 |

FOREIGN PATENT DOCUMENTS

| 191159 | 1/1923 | United Kingdom . |
| 193873 | 3/1924 | United Kingdom . |
| 232640 | 1/1926 | United Kingdom . |
| 274160 | 7/1927 | United Kingdom . |
| 369735 | 3/1932 | United Kingdom . |
| 701894 | 1/1954 | United Kingdom . |

Primary Examiner—Michael J. Tokar
Attorney, Agent, or Firm—Stanley Z. Cole; Edward H. Berkowitz

[57] ABSTRACT

An RF probe for a gyromagnetic resonance spectrometer includes a coil cage for supporting the probe coil preferably within the cage formed of a number of rod-like members displaced parallel to the coil axis and spaced apart from the axis at a constant distance. Access to the coil through an axial continuous slot 46 or equivalent eliminates axial discontinuity in susceptibility due to discrete holes in the coil form.

5 Claims, 8 Drawing Figures

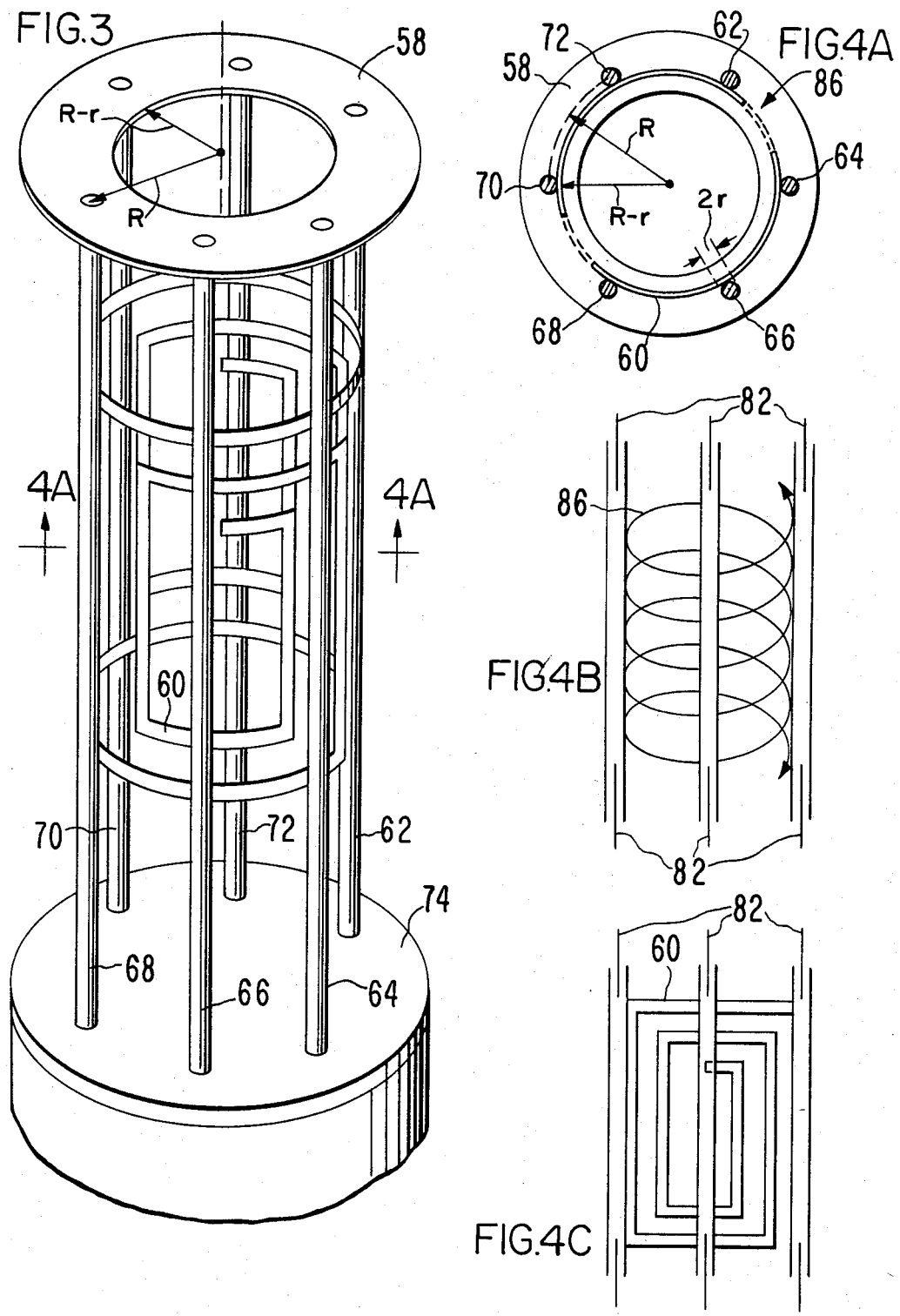

NMR PROBE COIL FORM STRUCTURE

FIELD OF THE INVENTION

The present invention relates generally to analytic instrumentation based upon magnetic resonance phenomena and particularly relates to reduction of magnetic perturbations due to inherent structure in the probe of an NMR spectrometer.

BACKGROUND OF THE INVENTION

In the typical nuclear magnetic resonance (NMR) analysis instrument, a sample is placed within a volume situated within a homogeneous region of magnetic field. Excitation and detection of resonance is obtained from a suitably placed coil (or coils) ordinarily spaced with respect to the sample and preferably enveloping it. Quite typically, for modern Fourier transform resonance spectroscopy, the sample is contained within a cylindrical tube disposed coaxial with, and within, a single coil and means are provided to rapidly rotate the sample tube about its axis to average any residual inhomogeneities for the magnetic field.

The material environment of the sample volume of typical prior art apparatus may contain a number of substances: the sample container, usually glass and possibly including a stopper delimiter of nylon or similar inert material; a conductive material forming the RF coil conductor, commonly copper, aluminum, silver, gold or platinum or a combination of these materials; a coil form supporting the coil; a bonding agent for securing the conductor to the coil form; one or more holes in the coil form for interconnection of coil winding components; and, air permeating all available spaces. These materials distinct from the sample and solvent itself, exhibit various magnetic susceptibilities and influence the signal by varying the magnetic field distribution throughout the sample. The relative rotation of the sample and the RF field acts to average sources of magnetic perturbations of non-cylindrical geometry whereby the average produces an equivalent cylindrical symmetry. Some of these sources have been considered in prior art compensatory schemes. Coil materials and bonding agent materials have been considered by Anderson, et al., U.S. Pat. No. 3,091,732 where it was sought to provide coil materials and bonding agents for securing the coil to a coil form, which materials were required to exhibit a magnetic susceptibility approximating air, (in which these components are necessarily submerged). The inhomogeneity due to structure present within the active volume of the spectrometer is compensated by fabricating a material which has magnetic properties identical with the properties of the solvent whereby axial homogeneity over the sample volume is contained. This is described in U.S. Ser. No. 482,344. The compensation of the geometric axial distribution of materials forming a saddle coil is discussed in U.S. Ser. No. 534,899.

In the prior art the form supporting the RF probe coil is a cylinder of glass or similar material. There are advantages for mounting the coil on the internal surface of the form to obtain closer coupling with the sample but there remains the requirement to provide access to the coil terminals. Holes may be provided in the form or else (saddle) coil leads must be directed along the form with insulation provided at the crossover point which necessarily occurs with saddle coil structure. Where the conductor is specially fabricated to exhibit a desired magnetic susceptibility the axial magnetic discontinuity as introduced by holes or insulating materials becomes relatively significant. Any such discontinuity within the active sample region and shorter than the axial extent of the active region will cause such a significant perturbation. For a spinning sample the discontinuity can be averaged azimuthally. If the discontinuity is lengthened in axial extent, the preferred cylindrical averaging will homogenize the perturbation and effectively eliminate it.

BRIEF DESCRIPTION OF THE DRAWINGS

FIG. 3 shows a preferred embodiment.

FIGS. 4a, 4b and 4c show an embodiment exhibiting additional axial compensation.

BRIEF DESCRIPTION OF THE INVENTION

A simple embodiment of the invention is apparent where a coil form which requires a hole in the cylindrical wall is furnished instead with a long slot extending longitudinally. Rotation of the sample results in averaging of the discontinuity in the azimuthal direction whereas the length of the slot assures axial continuity. If the slot is of constant width, the averaged magnetic susceptibility is independent of axial coordinate.

Cylindrical symmetry for coil support is here obtained in one embodiment by arranging a cage formed from a plurality of glass (or like material) rods or tubes, the axes of which lie on the circumference of a circle in the plane transverse to the coil axis. Preferably, a saddle coil is disposed within the cage. The resulting open structure of the cage permits access to saddle coil leads and provides an average cylindrical symmetry from the viewpoint of a spinning sample.

In that embodiment wherein the glass cylinders are hollow tubular members, additional compensation to achieve magnetic homogeneity can be accommodated in the interior of the tubes. In particular a helical coil occupying the central region, measured along the axis, of the active volume of the probe is contained within the desired structure. To maintain the average susceptibility prevailing in that central region (due to the coil) over a substantial axial region beyond the coil, a material of specified magnetic susceptibility is inserted in each tube to extend from the tube ends inwardly toward the central region terminating in the vicinity of the helical coil. The material is selected to provide a susceptibility, which averaged over the (imaginary) cylindrical surface, provides axial continuity between the central region and the adjacent areas.

DETAILED DESCRIPTION OF THE INVENTION

Figure 1:
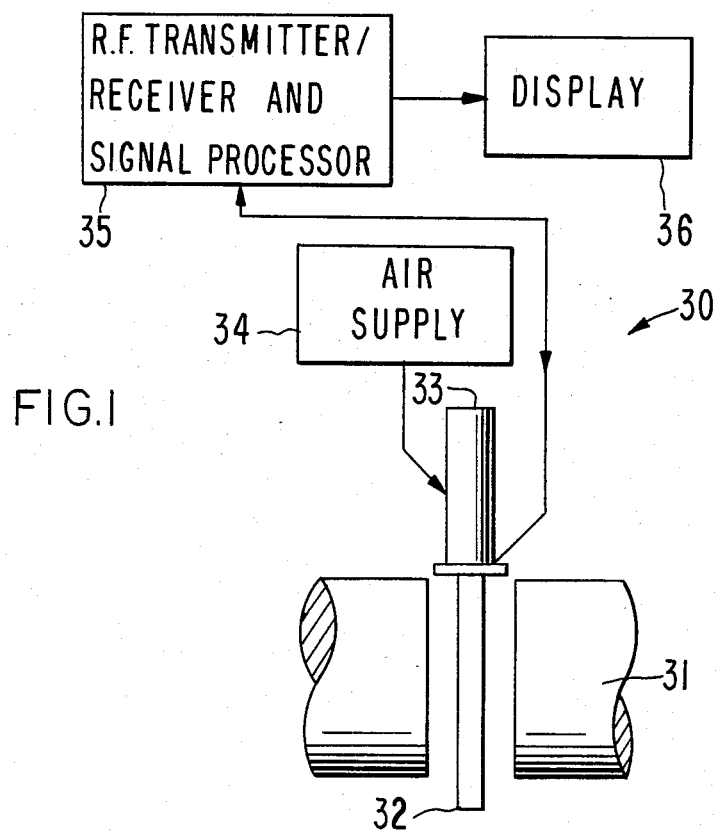
FIG. 1 schematically illustrates the context of the invention.

Referring now to FIG. 1 an NMR spectrometer 30 is shown in a schematic block diagram form to include a high field magnet symbolically indicated by poles 31 with an air gap into which a probe 32 is located. Secured to the top of the probe is a spinner assembly 33 which receives the sample tube, not shown. Spinner assembly 33 supports the spinning of the sample tube in the magnetic field, implemented form an air supply 34 connected to the spinner to provide rotation thereto. An RF transmitter/receiver in signal processor 35 is connected to the probe 32 which probe includes coils, not shown, for exciting and detecting resonant spectra of the sample in the sample tube. The signal processor also includes means for displaying the spectrum of the sample under examination as indicated symbolically by display means 36.

Figure 2:
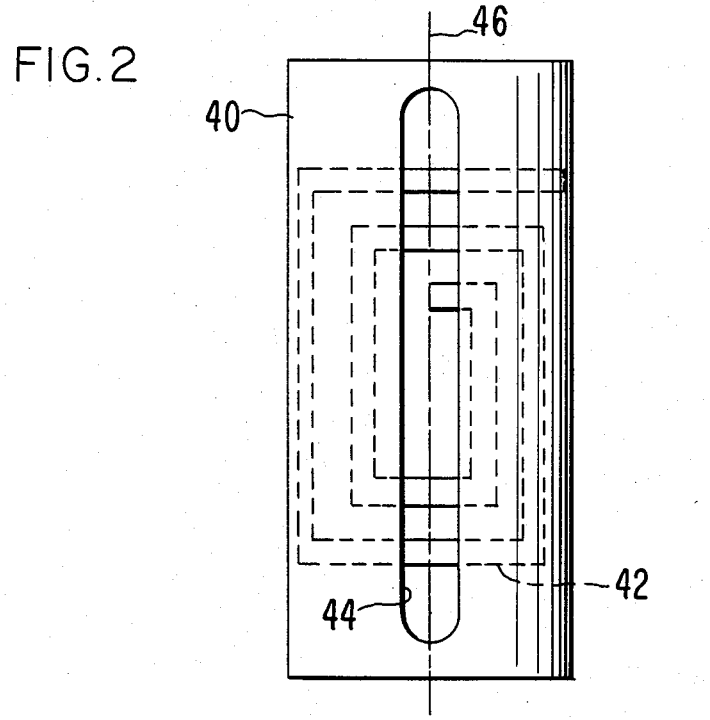
FIG. 2 shows a simple example of the principle of the invention.

FIG. 2 shows a conventional cylindrical coil form 40 for supporting on the interior thereof a saddle coil, a portion 42 of which is shown. A slot 44 has an axial extent in excess of the length of the coil. When a sample in the interior of the coil is spun about axis 46, the magnetic susceptibility of the form 40 and slot 44 is averaged azimuthally and the average is axially continuous.

Turning now to FIG. 3 there is shown in partial projection a saddle coil 60 of radius R-r nested within a cage 62 formed from a plurality of parallel rods or tubular members 64, 66, 68, 70. The rods or tubes are preferably of glass or ceramic or like material which does not contribute a resonant signal in the frequency spectrum under study. These members are spaced apart on the circumference of radius R and form an imaginary inscribed circular bound of radius R-r where r is the radius of a tubular member 64, 66, etc. The cage 62 has end plates 72 and 74 which contain holes bored on the said circle of radius R to receive the rod or tubular members. The length of the cage is of course long compared to the actual length of the active volume which is substantially defined by the axial extent of the RF probe coil.

Figure 5A:
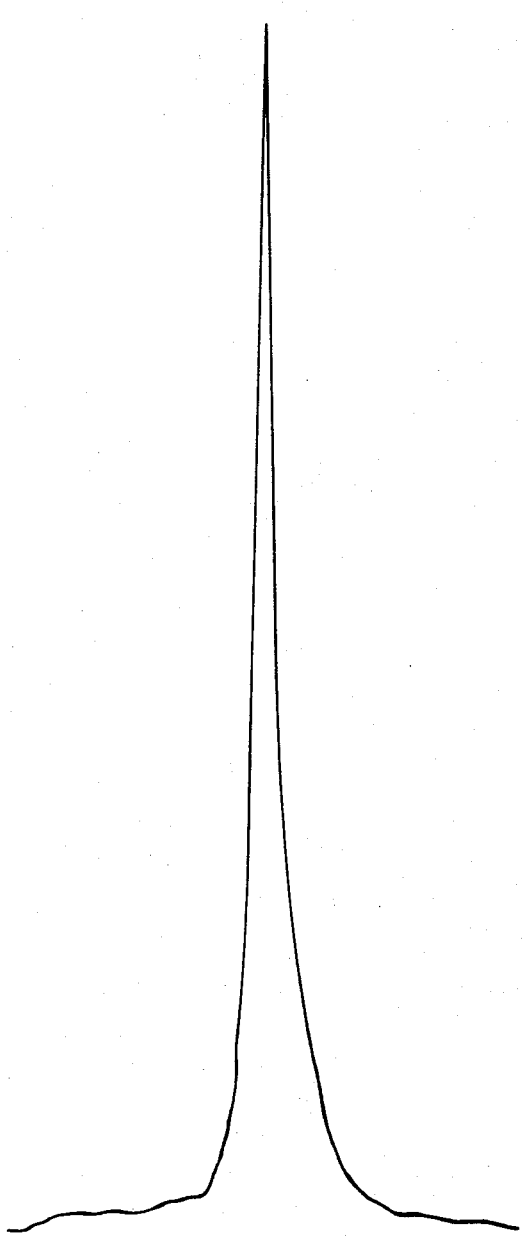
FIGS. 5 and and 5b compare spectra obtained with and without the present invention.
Figure 5B:
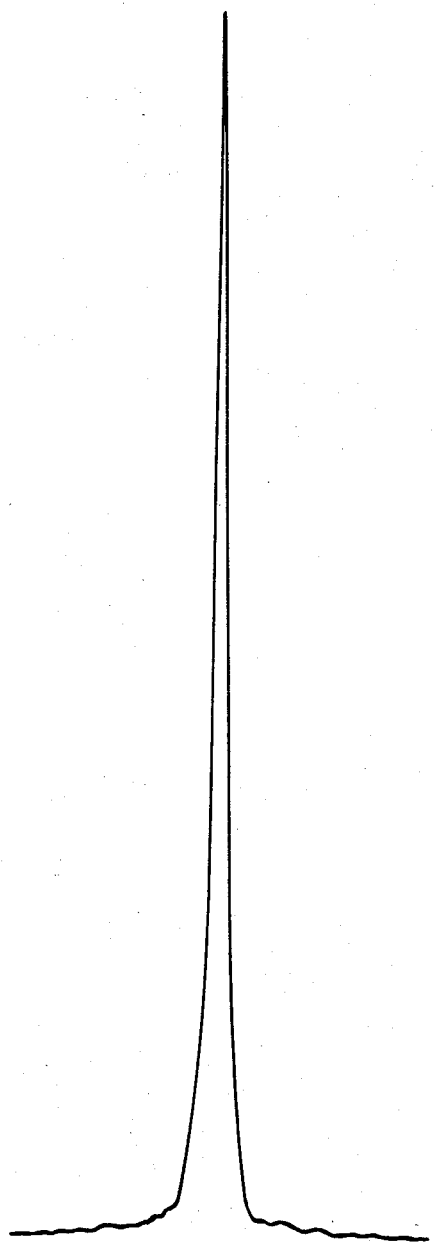

FIG. 4a shows in transverse section a saddle coil 76 (or alternately, a helical coil 86) supported by one or more, members 64, 66, etc. A projection from a longitudinal section is shown in FIGS. 4b and 4c for respectively a saddle coil 76 and a solenoidal coil 86. The members 64, 66, etc. are preferably hollow tubes into which compensatory bodies 82 are inserted respectively to axially extend the average magnetic susceptibility properties of the coil and coil form structure at least as averaged over a cylindrical surface of radius R-r. The material body 82 is selected to yield in the aggregate this desired average magnetic susceptibility. As a result, the axial continuity in magnetic susceptibility is established and spectra obtained therewith are characterized by the improved resolution and effective sensitivity concomitant with a magnetic field exhibiting reduced inherent gradients. FIGS. 5a and 5b are a comparison of the portion of the proton decoupled 13C signal of dioxane obtained with a prior art probe featuring a coil supported within a glass tube of radius 5.4 mm, (FIG. 5a). In FIG. 5b, the coil cage of the present invention supports an identical rf saddle coil (2.2 cm in length by 5.5 mm radius) and the same spectral region of the same molecule at the same concentration is shown to indicate the effect of the present invention. The same peak is plotted to the same statistical precision (number of transients). By inspection, the resolution is clearly improved and the high and low frequency tails of FIG. 5a are clearly suppressed in the peak of FIG. 5b.

It is to be understood that many changes can be made in this specifically described embodiments described above without departing from the scope of the invention, and that the invention is to be determined from the scope of the following claims, not limited into specifically described embodiments.

What is claimed is:

1. An RF probe for a spun sample gyromagnetic spectrometer comprising:
    (a) sample containment means for holding a sample for analysis,
    (b) sample spinning means for rapidly rotating said sample containment means about a rotation axis,
    (c) RF saddle coil means surrounding said sample containment means for exciting and detecting gyromagnetic resonance in said sample,
    (d) RF coil support means for supporting said RF coil in axial alignment with said rotation axis and spaced from said axis, said support means having at least one axially aligned slot in the lateral wall thereof, the axial length of said slot extending along substantially the axial length of said RF saddle coil means.

2. The RF probe of claim 1 wherein said coil is disposed within the interior of said coil support means.

3. The RF probe of claim 2 wherein said RF coil support means comprises an axially symmetric assembly of rigid axial support members disposed in the plane transverse to the symmetry axis, each member parallel to said axis and plate members for securing the ends of said axial members, whereby an open structure is formed for supporting said RF coil.

4. An RF probe for a spun sample gyromagnetic spectrometer comprising an RF coil surrounding a sample region and an axially symmetric assembly of rigid axial support members disposed on the circumference of a circle in the plane transverse to the symmetry axis of said coil, each member parallel to and displaced from said axis by constant distance, and planar members forming the ends of said support structure, whereby open structure is formed for support of said RF coil.

5. The RF coil support structure of claim 4, said rigid axial support members adapted to receive respective compensating members in proximity to the end regions of said axial support members, said compensating members selected to extend the average magnetic susceptibility of said coil region into said end regions.

* * * * *